United States Patent
Toh et al.

(10) Patent No.: US 7,307,443 B2
(45) Date of Patent: Dec. 11, 2007

(54) TEST SOCKET FOR AN INTEGRATED CIRCUIT

(75) Inventors: Chye Lin Toh, Singapore (SG); Boon Kiat Alex Chew, Singapore (SG)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/601,609

(22) Filed: Nov. 17, 2006

(65) Prior Publication Data

US 2007/0126456 A1  Jun. 7, 2007

Related U.S. Application Data

(63) Continuation of application No. PCT/SG2005/000151, filed on May 17, 2005.

(51) Int. Cl.
    *G01R 31/28* (2006.01)
(52) U.S. Cl. .................................. 324/765; 324/755
(58) Field of Classification Search ........ 324/755–762, 324/765; 439/70–73, 331; 257/687–700; 361/728
    See application file for complete search history.

(56) References Cited

U.S. PATENT DOCUMENTS 5,816,828 A * 10/1998 Ikeya et al. ................... 439/73
5,923,179 A    7/1999 Taylor
6,380,752 B1 * 4/2002 Irino ........................... 324/755
2003/0040139 A1  2/2003 Canella
2004/0174176 A1  9/2004 Kirby

FOREIGN PATENT DOCUMENTS

| JP | 08-069855 | 3/1996 |
| JP | 08220188 | 8/1996 |
| JP | 08-271578 | 10/1996 |
| JP | 2001-006832 | 1/2001 |

* cited by examiner

*Primary Examiner*—Vinh P. Nguyen
(74) *Attorney, Agent, or Firm*—Slater & Matsil, L.L.P.

(57) ABSTRACT

A test socket for an integrated circuit, wherein the test socket has a first plurality of test points for making electrical contact with contacts of a laminate package and a second plurality of test points for making electrical contact with contacts of a lead frame package. The test socket is suitable for testing, at one time: a laminate package, or a lead frame package, or both a laminate package and a lead frame package.

21 Claims, 3 Drawing Sheets

TEST SOCKET FOR AN INTEGRATED CIRCUIT

This application is a continuation of co-pending International Application No. PCT/SG2005/000151, filed May 17, 2005, which applications is incorporated herein by reference.

TECHNICAL FIELD

The invention relates to a test socket for an integrated circuit. In particular, the invention relates to a test socket for an integrated circuit that is suitable for testing either a lead frame package or a laminate package or both a lead frame package and a laminate package.

BACKGROUND

There are two main types of Integrated Circuit (IC) packages: lead frame packages and laminate frame packages.

In lead frame packages, the conductors consist of leads that have been produced from a single copper alloy strip by stamping or etching. The conductors are thick enough to impart mechanical rigidity to the package components during assembly. Typically, the lead frame package has leads that contact the printed circuit board (PCB) on which the IC package is located, at its periphery either along two opposite sides or on all four sides. One type of lead frame package is a Quad Flat Package (QFP), which may be a Metric QFP (MQFP) or a Thin QFP (TQFP).

Laminate packages, on the other hand, contain a PCB. The conductors in this case consist of traces etched in copper foil bonded to a reinforced polymer substrate. Laminate packages have several layers of conductors and planes with the inter-layer connection provided by through-hole plated vias. Laminate packages normally have an area array of leads. One very common (and commercially important) type of laminate package is the Ball Grid Array (BGA) package. In this case, the leads consist of balls of solder on the underside of the IC package. Another type of laminate package is a Chip Sized Package (CSP).

An integrated circuit package must be tested before the package is assembled to a higher assembly. Packages are typically tested at component level by placing the package into a test socket.

Many types of test sockets are known and each test socket is typically designed to test a particular type of package, be it a lead frame or a laminate package.

SUMMARY OF THE INVENTION

It is an object of the invention to provide a test socket that provides an improvement over known test sockets described above.

According to the invention, there is provided a test socket for an integrated circuit, the test socket comprising:

a first plurality of test points for making electrical contact with contacts of a laminate package; and a second plurality of test points for making electrical contact with contacts of a lead frame package, wherein the test socket is suitable for testing, at one time, a laminate package, or a lead frame package, or both a laminate package and a lead frame package.

The test socket has test points for both a laminate package and a lead frame package so allows either a laminate package, or a lead frame package or both types of package to be tested. This provides a single solution that can cater for both types of package.

In one embodiment of the invention, the first plurality of test points comprises a two dimensional array of test points. The test points in the array may be lined up in rows and columns (i.e., form a matrix) or may be in another arrangement suitable for making electrical contact with contacts on a laminate package being tested.

The first plurality of test points may be arranged to support a laminate package being tested. Thus, the test points can support the laminate package being tested and make electrical contact with the laminate package being tested, at the same time.

In one embodiment of the invention, the test socket may be arranged such that a laminate package being tested is held in a package holder. The package holder is, of course, arranged so that the contacts on the laminate package can still make electrical contact with the test points, even when the laminate package is held in the package holder. This is particularly important if the arrangement is such that the first plurality of test points are arranged to support the laminate package being tested.

The test points of the second plurality of test points are preferably located at the periphery of the test socket. Locating the test points for the lead frame package at the periphery of the test socket allows the contact leads of a lead frame package being tested to be in contact with the test points.

In one embodiment, the test socket is rectangular and the test points of the second plurality of test points are located at at least two edges of the rectangle. The test points of the second plurality of test points may be located at four edges of the rectangle. If the test points are located at two of the edges, this arrangement caters for dual-sided lead frame packages. If the test points are located at four of the edges, this arrangement caters for quad lead frame packages. The test points might equally be located at one of the edges or three of the edges.

The test socket may comprise a base. The test socket may comprise a top. In one advantageous embodiment, the test socket further comprises a base and a top and the test socket is arranged such that, when one or more packages are being tested, each package being tested is sandwiched between the base and the top. Sandwiching the packages being tested, can improve the electrical contact between the contacts on the package and the first and/or second plurality of test points. When only one package is being tested, a spacer may be required between the base and the top so that the package and spacer are sandwiched between the base and the top.

In one preferred embodiment, the test socket comprises a base and a top and the first plurality of test points are provided on resiliently compressible supports extending from the base. In this embodiment, the test socket is preferably arranged such that, when one or more packages are being tested, each package being tested is sandwiched between the supports on the base and the top and the supports are compressed. This arrangement can improve the electrical contact between the contacts on the package and the first and/or second plurality of test points since each support can individually compress a suitable amount to compensate for irregularities in the dimensions of the package being tested and hence ensure a good connection at every testing point.

In one embodiment, when the test socket is being used to test a laminate package and a lead frame package at the same time, the laminate package may be supported on the first plurality of test points, contacts of the laminate package being in electrical contact with the first plurality of test points, and the lead frame package may be supported on the laminate package, contacts of the lead frame package being in electrical contact with the second plurality of test points. In this embodiment, the two packages being tested are stacked up, one on top of another. The test socket may comprise a base and a top and the laminate package and the lead frame package being tested may be sandwiched between the base and the top.

In one embodiment, when the test socket is being used to test only a laminate package, the laminate package may be supported on the first plurality of test points, contacts of the laminate package being in electrical contact with the first plurality of test points.

In this embodiment, the test socket may comprise a base and a top and the laminate package being tested may be located between the base and the top. In that case, the laminate package being tested and a spacer may be sandwiched between the base and the top. The laminate package being tested may be supported on the base and the spacer may be supported on the laminate package being tested.

In one embodiment, when the test socket is being used to test only a lead frame package, contacts of the lead frame package may be in electrical contact with the second plurality of test points.

In this embodiment, the test socket may comprise a base and a top and the lead frame package being tested may be located between the base and the top. In that case, the lead frame package being tested and a spacer may be sandwiched between the base and the top. The spacer may be supported on the base and the lead frame package being tested may be supported on the spacer. The spacer may be a package holder for holding a laminate package.

According to the invention, there is also provided a test socket for an integrated circuit, the test socket comprising a base, a first plurality of test points on the base for making electrical contact with contacts of a laminate package, the first plurality of test points being arranged to support the laminate package, a second plurality of test points for making electrical contact with contacts of a lead frame package, the second plurality of test points being located at the edge of the test socket, and a top, wherein, when a laminate package and a lead frame package are being tested at the same time, the lead frame package is supported on the laminate package and the two packages are sandwiched between the base and the top, and wherein, when one package is being tested, the package and a spacer are sandwiched between the base and the top.

BRIEF DESCRIPTION OF THE DRAWINGS

By way of example, an embodiment of the invention will now be described with reference to the accompanying drawings, of which.

DETAILED DESCRIPTION OF ILLUSTRATIVE EMBODIMENTS

Figure 1:
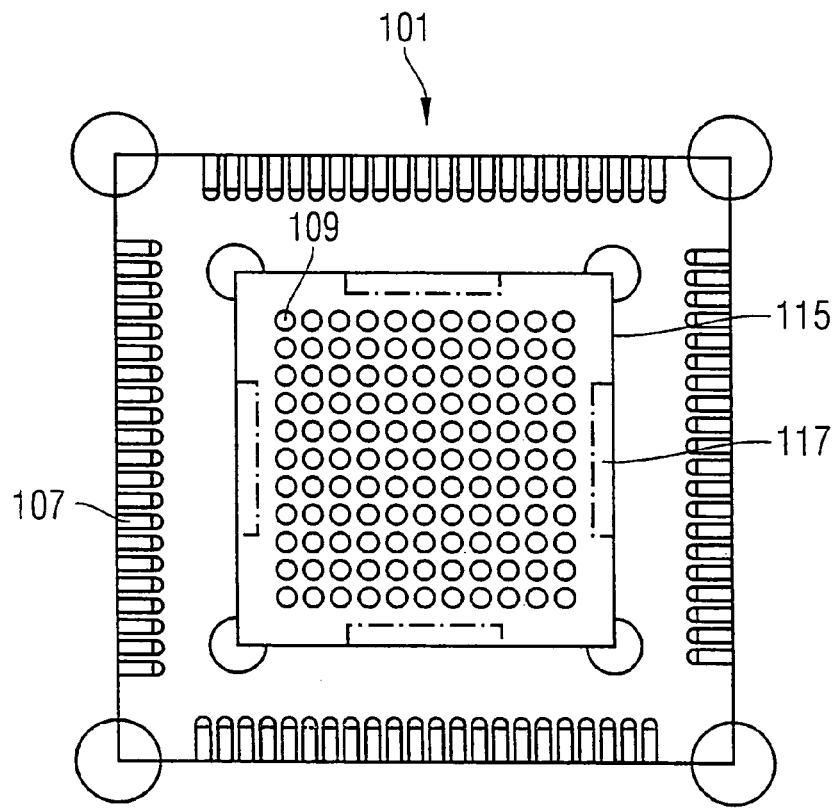
FIG. 1 is a plan view of a test socket according to an embodiment of the invention.
Figure 2:
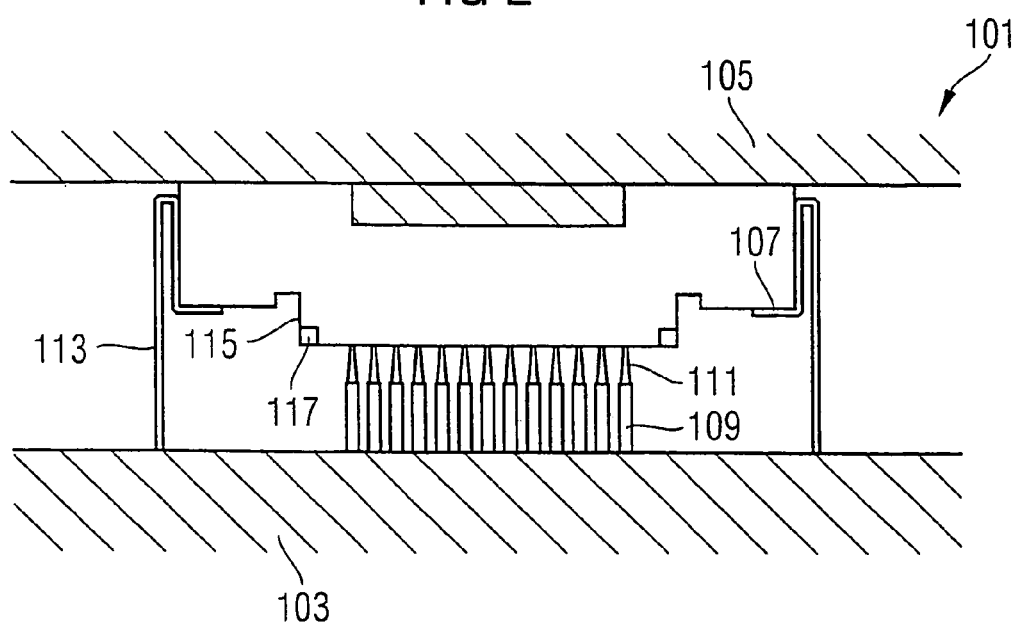
FIG. 2 is a sectional view of the test socket of FIG. 1.

FIGS. 1 and 2 show a test socket 101 according to an embodiment of the invention. The test socket 101 comprises a base 103, a top 105, a plurality of QFP testing points 107 and a plurality of supports 109 for a BGA package, the top of each support 109 having a BGA testing point 111. Each QFP testing point 107 is externally connected via connections 113 shown in FIG. 2. On the supports 109 there is a package holder 115 for holding a BGA package to be tested. The package holder 115 has a ledge 117 at each edge for supporting the BGA package, as will be described further below.

The BGA testing points 111 are arranged in a matrix such that solder balls on the base of a BGA package to be tested can make electrical contact with the BGA testing points. The BGA testing points are located on the supports 109, which extend upwards such that the BGA testing points are located above the base 103. The supports, in this embodiment, are known in the art as "pogo pins." Pogo pins are available in different sizes, which will determine how far above the base the BGA package is supported. The package holder 115 is arranged to hold a BGA package to be tested but to allow solder balls on the base of the BGA package to contact the BGA testing points 111. When a BGA package is being tested, the package is supported on the ledges 117 and the solder balls extend downwards to make contact with the testing points 111. The package holder is useful so that the BGA package being tested is confined and cannot move laterally, so as to ensure that the solder balls on the underside of the BGA package make good contact with the testing points 111.

The QFP testing points 107 are located at the four edges of the square test socket, so that leads from a QFP being tested can easily make contact with the QFP testing points 107. The QFP testing points 107 are above the BGA testing points 111 such that, when two packages to be tested are stacked up between the base and the top, the QFP being supported on the BGA package, the two packages can make electrical contact with their respective testing points.

The test socket shown in FIGS. 1 and 2 can be used to test a QFP and a BGA package at the same time, (the QFP being connected to the QFP testing points 107, the BGA package being connected to the BGA testing points 111), or to test only a QFP or to test only a BGA package.

Figure 3:
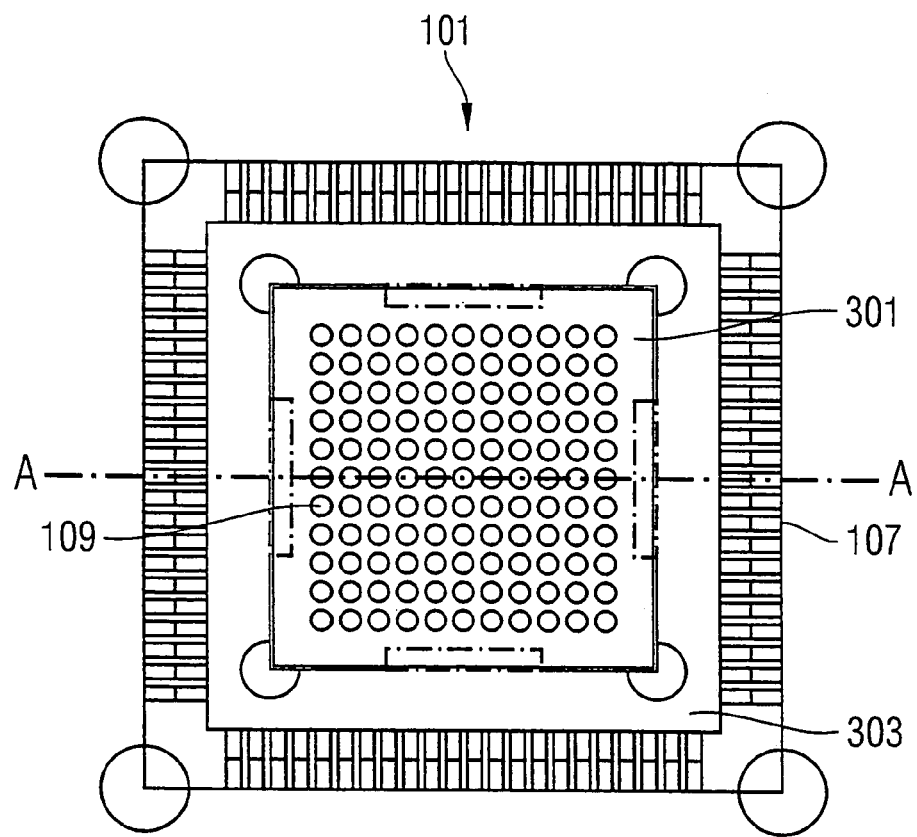
FIG. 3 is a plan view of the test socket of FIGS. 1 and 2 when testing a Quad Flat Package and a Ball Grid Array Package.
Figure 4:
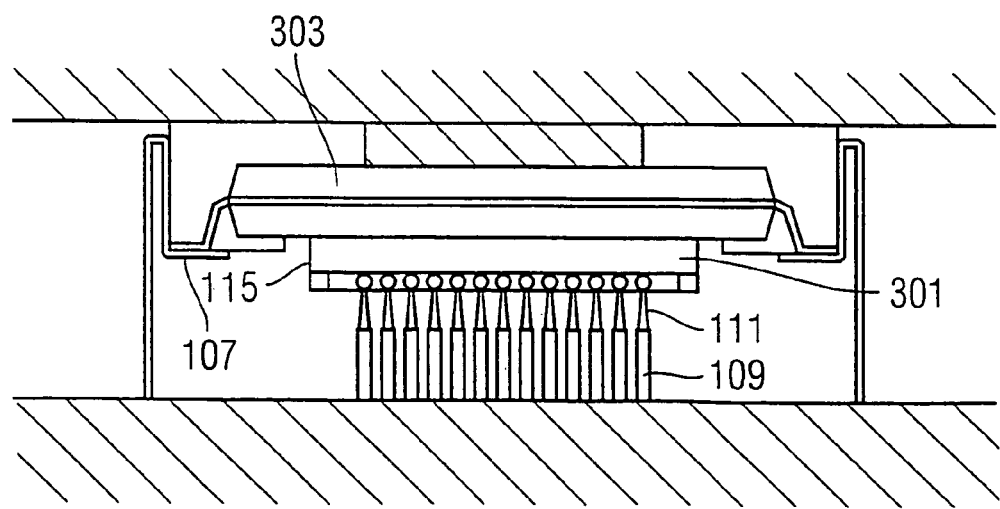
FIG. 4 is a sectional view along line A-A in FIG. 3.

FIGS. 3 and 4 show the test socket being used to test a QFP and a BGA package at the same time and it can be seen that the two packages are stacked one on top of the other. BGA package 301 is held in the package holder 115 (on the ledges 117), which is supported on the supports 109. Each solder ball on the underside of the BGA package is in contact with a BGA testing point 111. Supported on the BGA package is a QFP 303. The leads of the QFP are in contact with the QFP testing points 107. The top 105 of the test socket holds the packages in place and ensures a good connection between the solder balls on the underside of the BGA package and the BGA testing points and between the QFP leads and the QFP testing points. This is aided because the supports are springy so that, when the top is put on the test socket, a tight fit is formed ensuring good connections. The top may be secured with, for example, a clip fit.

Figure 5:
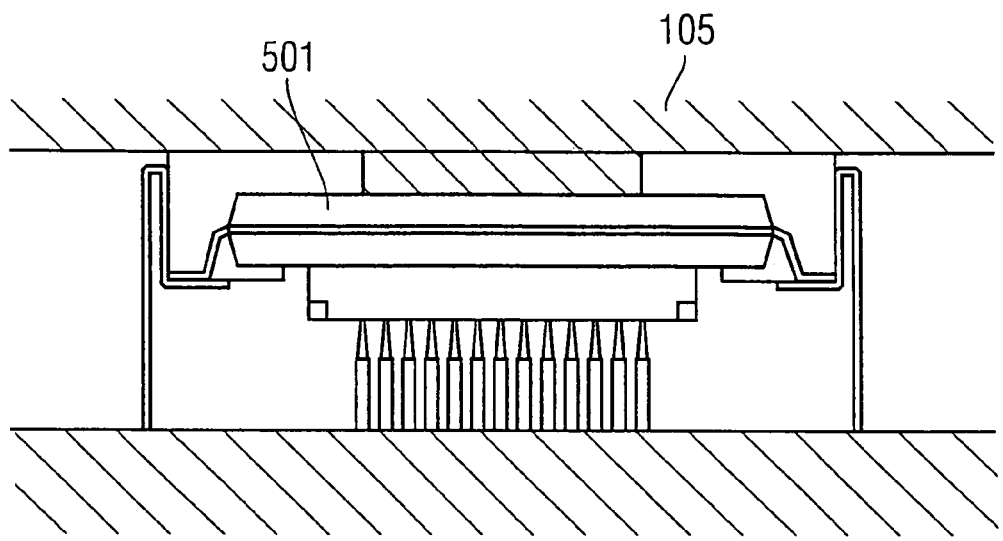
FIG. 5 is a sectional view of the test socket of FIGS. 1 and 2 when testing a Quad Flat Package.

FIG. 5 shows the test socket being used to test just a QFP 501. No BGA package is in the package holder 115 but on the package holder 115 is a QFP 501 whose leads are in contact with the QFP testing points 107. The package holder acts as a spacer and supports the QFP. The package holder and the QFP being tested are stacked up and the top 105 of the test socket holds the QFP in place and ensures a good connection between the QFP leads and the QFP testing points. The compressible pogo pins also assist with the connection.

Figure 6:
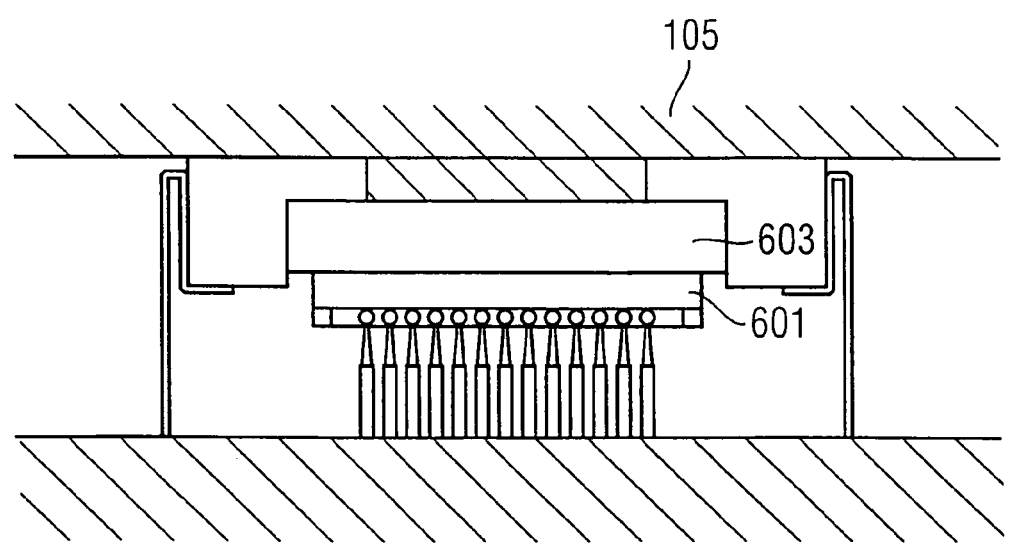
FIG. 6 is a sectional view of the test socket of FIGS. 1 and 2 when testing a Ball Grid Array Package.

FIG. 6 shows the test socket being used to test just a BGA package 601. The BGA package 601 is held in the package holder 115 and the solder balls on the underside of the BGA package are in contact with the BGA testing points 111. Supported on the BGA package 601 is a spacer 603 which takes the place of the QFP when no QFP is being tested. The spacer 603 ensures that, when the BGA package and the spacer are stacked up, the top 105 of the test socket produces a tight fit, holding the BGA package in place and ensuring a good connection between the solder balls on the underside of the BGA package and the BGA testing points. The squashable pogo pins also assist with the connection.

As can be seen from FIGS. 1 to 6 and the accompanying description, the test socket can be used to test a QFP (i.e., lead frame package) and a BGA (i.e., laminate package) at the same time or, just a QFP can be tested, or, just a BGA package can be tested. Thus, a single test socket can be used to test either a lead frame package or a laminate package or both. That is, one solution can cater for both lead frame packages and laminate packages.

This arrangement clearly has many advantages. The expense and inconvenience of acquiring and stocking many test sockets for different types of packages are eliminated. The test time may be reduced since two packages may be tested simultaneously in a single test socket. Fewer test sockets are required to test the same number of packages.

The embodiment described above comprises a test socket for testing a QFP and a BGA package. It should be understood, however, that the invention is not limited to QFP and BGA but to any types of lead frame and laminate packages. Similarly, other variations may be envisaged. For example, the lead frame package may be held in a package holder when being tested, like the laminate package, or the laminate package testing points may be located directly on the base (i.e., without the upwardly extending supports).

What is claimed is:

1. A test socket for an integrated circuit, the test socket comprising:
   a first plurality of test points for making electrical contact with contacts of a laminate package; and
   a second plurality of test points for making electrical contact with contacts of a lead frame package,
   wherein the test socket is suitable for testing, at one time, the laminate package, or the lead frame package, or both the laminate package and the lead frame package.

2. The test socket according to claim 1, wherein the first plurality of test points comprises a two dimensional array of test points.

3. The test socket according to claim 1, wherein the first plurality of test points is arranged to support the laminate package being tested.

4. The test socket according to claim 1, wherein the test socket is arranged such that the laminate package being tested is held in a package holder.

5. The test socket according to claim 1, wherein the test points of the second plurality of test points are located at a periphery of the test socket.

6. The test socket according to claim 5, wherein the test socket is rectangular and the test points of the second plurality of test points are located at at least two edges of the rectangle.

7. The test socket according to claim 6, wherein the test points of the second plurality of test points are located at four edges of the rectangle.

8. The test socket according to claim 1, further comprising a base and atop, the test socket being arranged such that, when one or more packages are being tested, each package being tested is sandwiched between the base and the top.

9. The test socket according to claim 1, wherein the test socket comprises a base and a top and the first plurality of test points are provided on resiliently compressible supports extending from the base.

10. The test socket according to claim 9, wherein the test socket is arranged such that, when one or more packages are being tested, each package being tested is sandwiched between the supports on the base and the top and the supports are compressed.

11. The test socket according to claim 1, wherein, when the test socket is being used to test the laminate package and the lead frame package at the same time:
    the laminate package is supported on the first plurality of test points, contacts of the laminate package being in electrical contact with the first plurality of test points, and
    the lead frame package is supported on the laminate package, contacts of the lead frame package being in electrical contact with the second plurality of test points.

12. The test socket according to claim 11, wherein the test socket comprises a base and a top and wherein the laminate package and the lead frame package being tested are sandwiched between the base and the top.

13. The test socket according to claim 1, wherein, when the test socket is being used to test only the laminate package, the laminate package is supported on the first plurality of test points, contacts of the laminate package being in electrical contact with the first plurality of test points.

14. The test socket according to claim 13, wherein the test socket comprises a base and a top and wherein the laminate package being tested is located between the base and the top.

15. The test socket according to claim 14, wherein the laminate package being tested and a spacer are sandwiched between the base and the top.

16. The test socket according to claim 15, wherein the laminate package being tested is supported on the base and the spacer is supported on the laminate package being tested.

17. The test socket according to claim 1, wherein, when the test socket is being used to test only the lead frame package, contacts of the lead frame package are in electrical contact with the second plurality of test points.

18. The test socket according to claim 17, wherein the test socket comprises a base and a top and wherein the lead frame package being tested is located between the base and the top.

19. The test socket according to claim 18, wherein the lead frame package being tested and a spacer are sandwiched between the base and the top.

20. The test socket according to claim 19, wherein the spacer is supported on the base and the lead frame package being tested is supported on the spacer.

21. A test socket for an integrated circuit, the test socket comprising:
   a base;
   a first plurality of test points on the base for making electrical contact with contacts of a laminate package, the first plurality of test points being arranged to support the laminate package;
   a second plurality of test points for making electrical contact with contacts of a lead frame package, the second plurality of test points being located at an edge of the test socket; and
   a top,
      wherein, when a laminate package and a lead frame package are being tested at the same time, the lead frame package is supported on the laminate package and the two packages are sandwiched between the base and the top.

* * * * *